(12) United States Patent
Montgomery et al.

(10) Patent No.: US 9,761,550 B2
(45) Date of Patent: Sep. 12, 2017

(54) POWER SEMICONDUCTOR DEVICE WITH A DOUBLE METAL CONTACT AND RELATED METHOD

(71) Applicant: Infineon Technologies Americas Corp., El Segundo, CA (US)

(72) Inventors: Robert Montgomery, Cardill (GB); Hugo Burke, Llantrisant (GB); Phillip Parsonage, Penarth (GB); Susan Johns, Cardiff (GB); David Paul Jones, South Glamorgan (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 25 days.

(21) Appl. No.: 15/098,116

(22) Filed: Apr. 13, 2016

(65) Prior Publication Data

US 2016/0233185 A1   Aug. 11, 2016

Related U.S. Application Data

(62) Division of application No. 14/333,958, filed on Jul. 17, 2014, now Pat. No. 9,318,355, which is a division
(Continued)

(51) Int. Cl.
| | | |
|---|---|---|
| H01L 23/00 | (2006.01) | |
| H01L 29/66 | (2006.01) | |
| H01L 29/78 | (2006.01) | |
| H01L 21/56 | (2006.01) | |
| H01L 29/417 | (2006.01) | |

(52) U.S. Cl.
CPC ............. *H01L 24/11* (2013.01); *H01L 21/56* (2013.01); *H01L 24/02* (2013.01); *H01L 24/10* (2013.01); *H01L 24/13* (2013.01); *H01L 29/66734* (2013.01); *H01L 29/78* (2013.01); *H01L 29/7811* (2013.01); *H01L 29/7813* (2013.01); *H01L 29/41775* (2013.01); *H01L 2224/0401* (2013.01); *H01L 2224/11019* (2013.01); *H01L 2224/11466* (2013.01); *H01L 2224/11831* (2013.01); *H01L 2224/13* (2013.01); *H01L 2224/13099* (2013.01); *H01L 2224/16* (2013.01); *H01L 2924/014* (2013.01); *H01L 2924/01013* (2013.01); *H01L 2924/01014* (2013.01); *H01L 2924/01015* (2013.01); *H01L 2924/01082* (2013.01); *H01L 2924/05042* (2013.01); *H01L 2924/05494* (2013.01); *H01L 2924/13091* (2013.01)

(58) Field of Classification Search
CPC . H01L 2924/00; H01L 2224/13; H01L 24/13; H01L 21/56; H01L 2224/0401; H01L 2224/11019; H01L 2224/11466; H01L 2224/11831; H01L 2224/13099; H01L 2224/16; H01L 24/02; H01L 24/10; H01L 24/11; H01L 29/78; H01L 29/7813; H01L 29/7811
See application file for complete search history.

(56) References Cited

U.S. PATENT DOCUMENTS

| | | | | |
|---|---|---|---|---|
| 6,025,230 A | * | 2/2000 | Hshieh | H01L 29/402 |
| | | | | 257/E21.418 |
| 2002/0140042 A1 | * | 10/2002 | Stout | H01L 21/2815 |
| | | | | 257/401 |

\* cited by examiner

*Primary Examiner* — Caridad Everhart
(74) *Attorney, Agent, or Firm* — Murphy, Bilak & Homiller, PLLC

(57) ABSTRACT

A power semiconductor device that includes a stack of a thin metal layer and a thick metal layer over the active region thereof, and a method for the fabrication thereof.

18 Claims, 5 Drawing Sheets

Related U.S. Application Data of application No. 12/036,718, filed on Feb. 25, 2008, now Pat. No. 8,791,525.

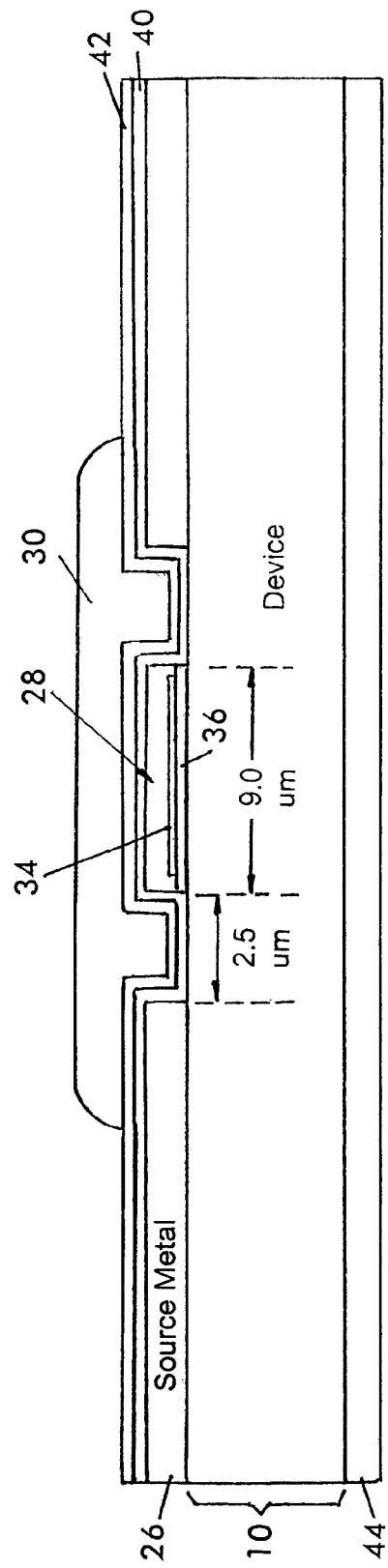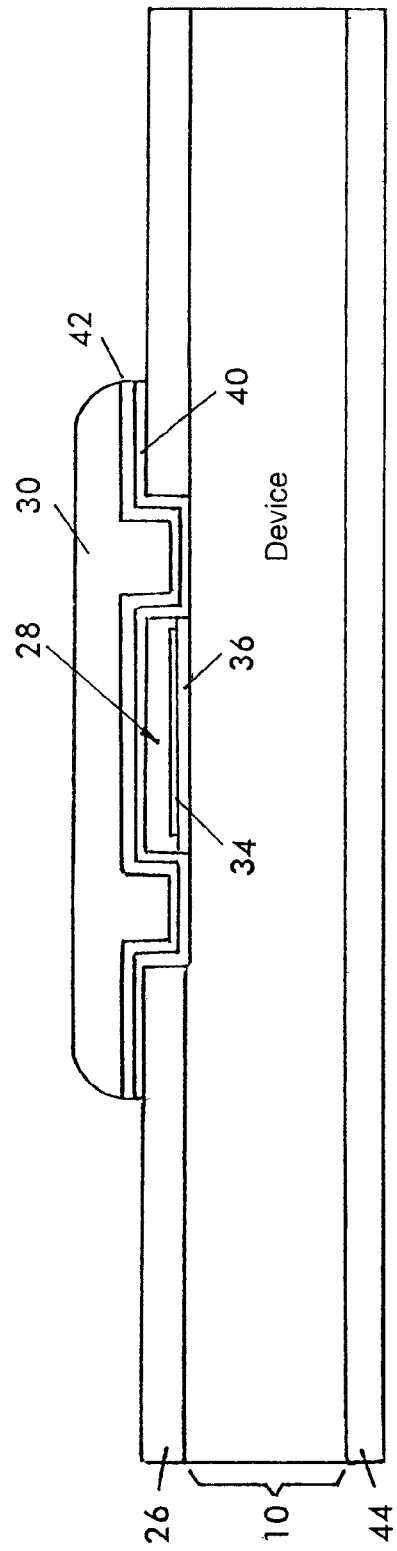
FIG. 2D
FIG. 2E

POWER SEMICONDUCTOR DEVICE WITH A DOUBLE METAL CONTACT AND RELATED METHOD

This is a divisional of application Ser. No. 14/333,958 filed Jul. 17, 2014, which itself is a divisional of application Ser. No. 12/036,718 filed Feb. 25, 2008, now U.S. Pat. No. 8,791,525. The disclosures in the above-identified patent applications are hereby incorporated fully by reference into the present application.

FIELD OF INVENTION

The present invention relates to power semiconductor devices and a method for the fabrication thereof.

BACKGROUND OF THE INVENTION

Conventional power MOSFETs use a thick (4 to 10 μm) top layer of metallization for connection to the source regions thereof due to the large currents that the metal has to conduct during the operation of the device. Because of the thickness of the top metal, wet etching is used to pattern the same during fabrication. The use of wet etching requires the metal design rules to be large. Therefore, multiple gate buses in a conventional power MOSFET consume a large area of the semiconductor die, which could otherwise be used for the active part of the device.

When a power MOSFET is configured for flip-mounting onto conductive pads using solder or the like additional issues further lead to the inefficient use of semiconductor area. For example, the gate pad required for flip-mounting is large compared with a wire-bonded device, which wastes more semiconductor area that could be used for the active region of the device. In addition, the layout of a large source pad required for flip-mounting may restrict the use of multiple gate buses.

SUMMARY OF THE INVENTION

In a power semiconductor according to the present invention the thick metal layer in a conventional device is replaced by a thin metal layer (e.g. 1-2 μm) which can be dry etched. The thin metal layer is then patterned to obtain a metallic gate bus that is then preferably encapsulated in a hermetic seal, followed by formation of a thick stress relieving buffer body. The buffer body allows the deposition of a thick (e.g. 4-20 μm) second metal layer to be added by preventing stress-related cracking of the hermetic seal during reliability testing such as temperature cycling. The thick second metal layer, which is thick enough to carry current as required by a power semiconductor device, can be then wet etched.

Advantageously, the thick second metal layer can be thicker than conventional front metal bodies in that no gate buses are required to be patterned out of the same.

Other features and advantages of the present invention will become apparent from the following description of the invention which refers to the accompanying drawings.

BRIEF DESCRIPTION OF THE FIGURES

FIGS. 2A-2E illustrate steps in the fabrication of a device according to the present invention.

DETAILED DESCRIPTION OF THE FIGURES

Figure 1A:
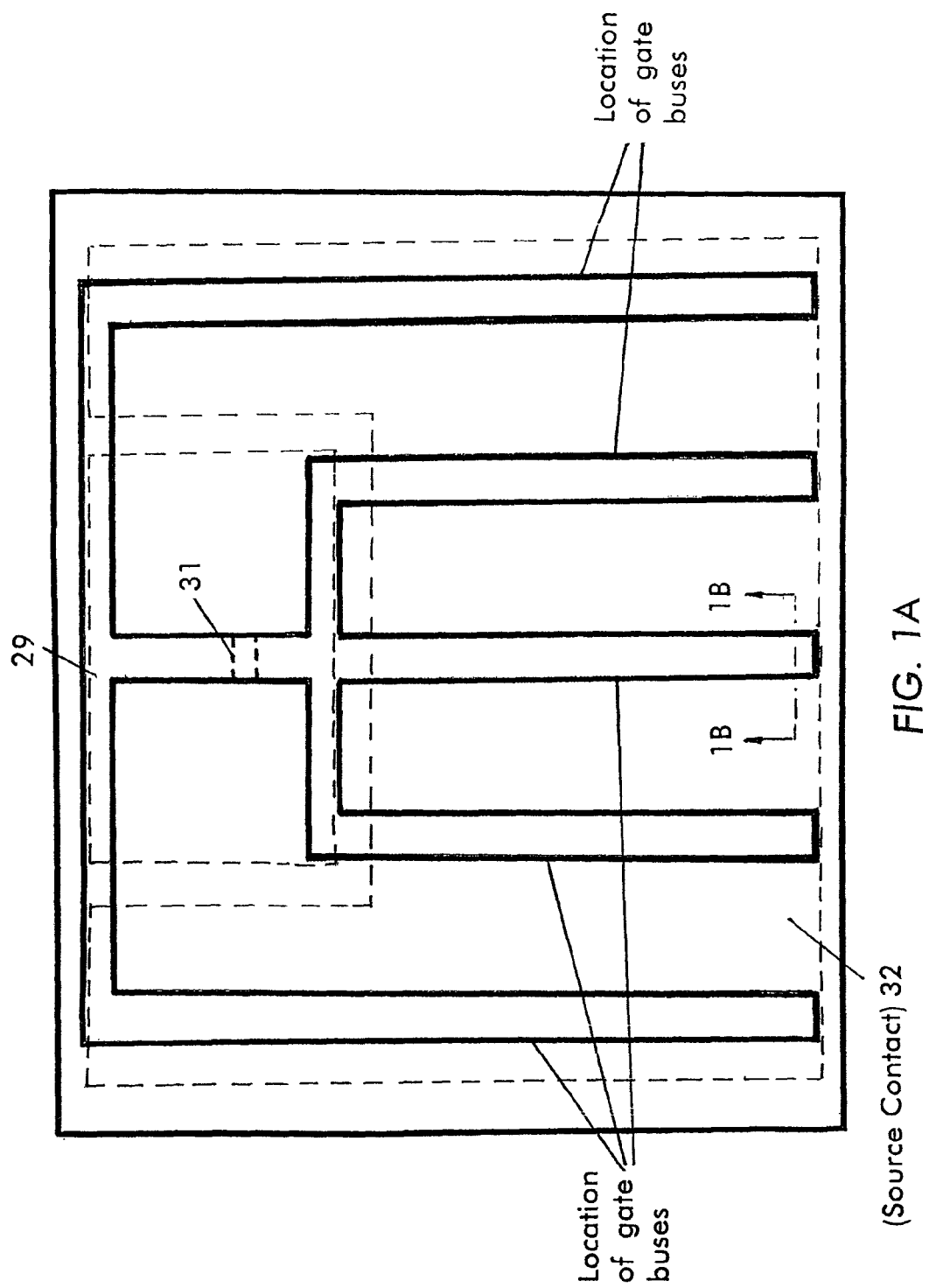
FIG. 1A schematically illustrates a top plan view of a power MOSFET according to the present invention (source and gate pads rendered transparent to illustrate positions of gate buses).
Figure 1B:
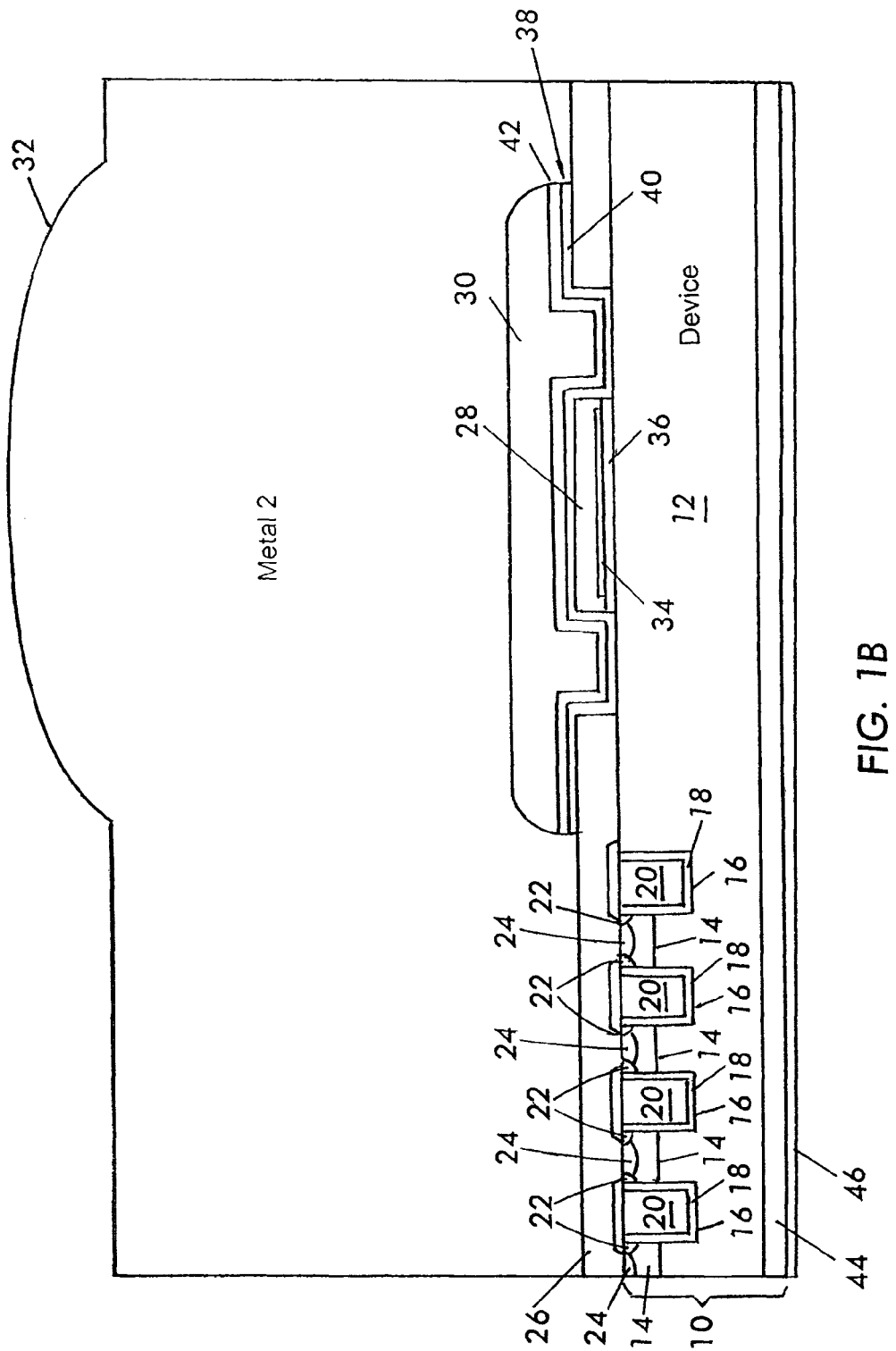
FIG. 1B illustrates a cross-sectional view of a power MOSFET according to one embodiment of the present invention along line 1B-1B and viewed in the direction of the arrows.

Referring to FIGS. 1A and 1B, a power semiconductor device according to the present invention is preferably a power MOSFET which includes a semiconductor body 10 having an active region formed on one surface thereof. The active region includes a drift region 12 of one conductivity (e.g. N-type), a base region 14 of another conductivity (e.g. P-type), a plurality of gate trenches formed inside semiconductor body 10 and extending from the top surface thereof through base region 14 into at least drift region 12, an insulated gate received inside each gate trench 16 (each insulated gate including a gate dielectric 18 such as $SiO_2$ along at least the sidewalls of a respective trench 16 and a gate electrode 20 formed with polysilicon or the like), source regions 22 formed inside base region 14 adjacent respective trenches 16, high conductivity contact regions 24 of the same conductivity type as base region 14 formed therein between respective source regions 22, a first metal (e.g. aluminum) layer 26 disposed over and coupled to source regions 22 and high conductivity contact regions 24, a metallic gate bus 28 disposed over the top surface of semiconductor body 10 lateral to and spaced from first metal layer 26, buffer body 30 disposed over metallic gate bus 28 and the space between gate bus 28 and first metal layer 26, and a second metal (e.g. aluminum) layer disposed over first metal layer 26 and extending over buffer layer 30. Note that buffer layer 30 may reside over a hermetic sealant body 38. Note further that preferably semiconductor body 10 resides on a semiconductor substrate 44 of the same conductivity to which a drain contact 46 is ohmically coupled. In addition, insulation interlayers 23 are provided to insulate each gate electrode 20 from first metal layer 26.

Metallic gate bus 28 is preferably disposed over and ohmically coupled to a polysilicon gate bus 34 which is connected to gate electrodes 20. Polysilicon gate bus 34 is disposed over an insulation body 36 (e.g. $SiO_2$), which is atop semiconductor body 10 to insulate polysilicon gate bus 34 from semiconductor body 10. Metallic gate bus 28 is coupled to a metallic gate pad 29 (FIG. 1A) somewhere over body 10, gate pad 29 serving as a pad for external connection. Note that second metal body 32 also serves as a source contact pad for external connection. Preferably, second metal layer 32 and the gate pad are configured for flip-mounting onto a conductive pad of a circuit board using a conductive adhesive (e.g. solder or the like).

Figure 1C:
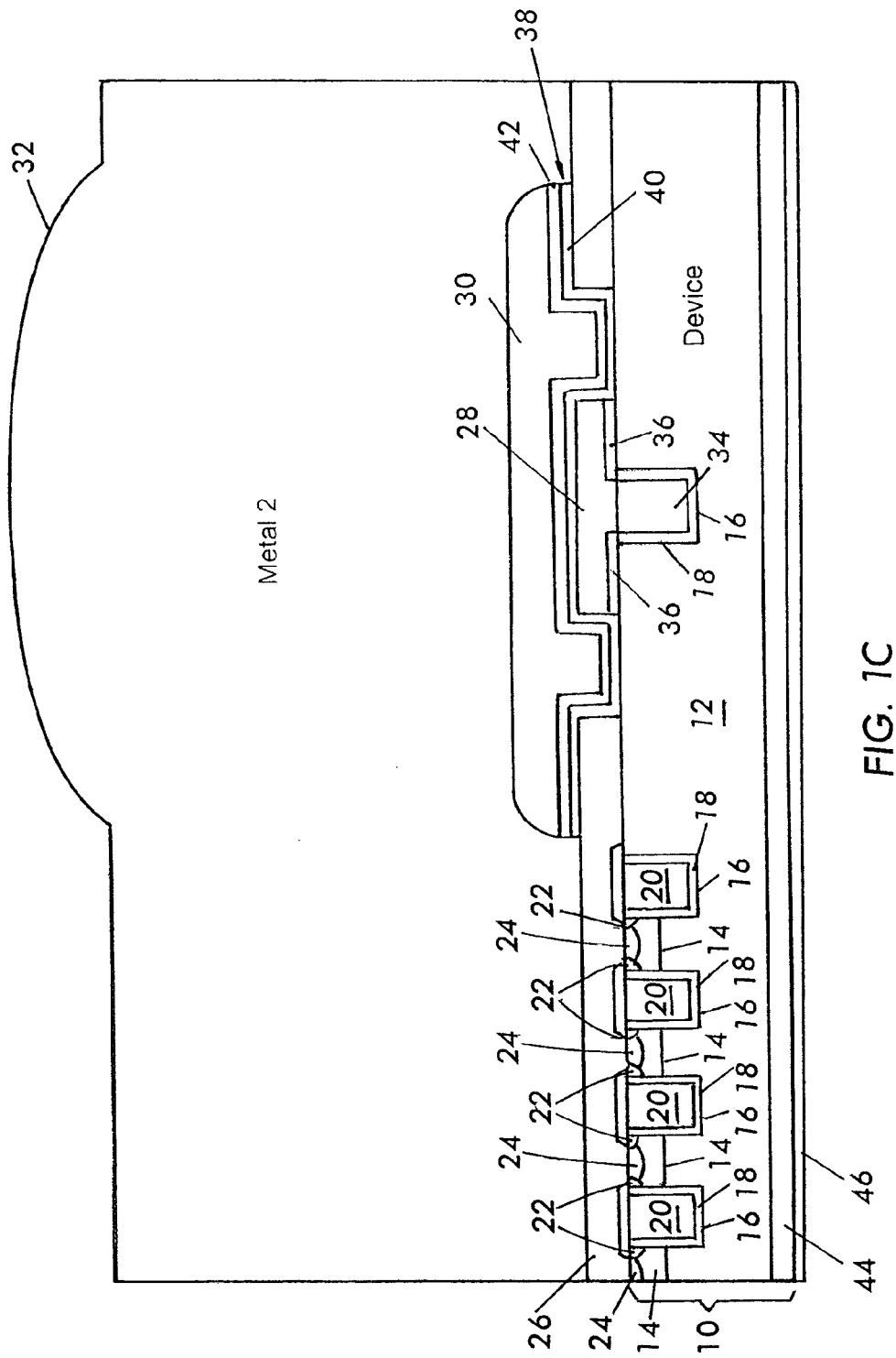
FIG. 1C illustrates a cross-sectional view of a power MOSFET according to an alternative embodiment viewed also along line 1B-1B in the direction of the arrows.

Referring to FIG. 1C, in an alternative embodiment, polysilicon gate bus 34 resides inside an insulated trench 16, and metallic gate bus 28 makes connection to polysilicon gate bus 34 preferably inside trench 16. Note that insulation body 36 insulates metallic gate bus from the semiconductor body therebelow.

Preferably, first metal layer 26 and metallic gate bus 28 are less than 2 microns thick, while second metal layer 32 is between 4 to 20 microns thick. Furthermore, buffer body 30 is made of polyimide, while hermetic sealant body 38 is a stack including a layer of photo silicate glass 40 (PSG), and a silicon nitride layer 42 between PSG 40 and buffer body 30.

Figure 2A:
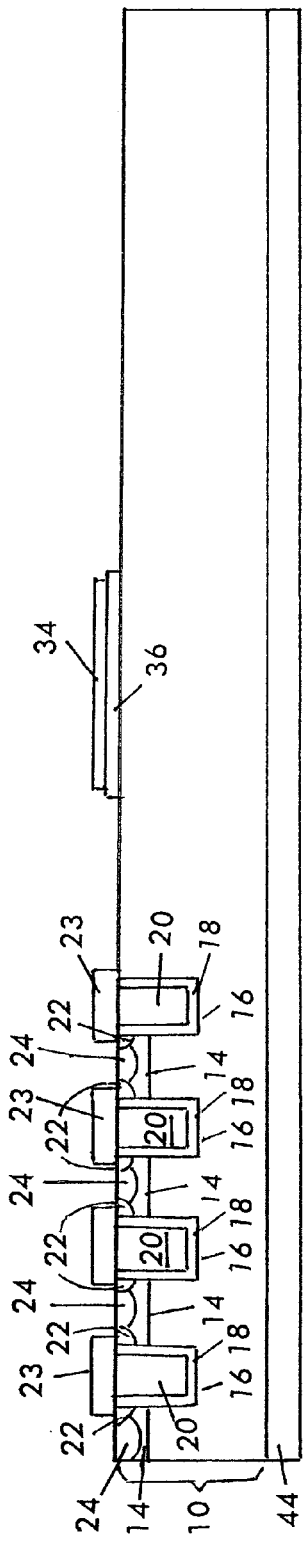
Figure 2B:
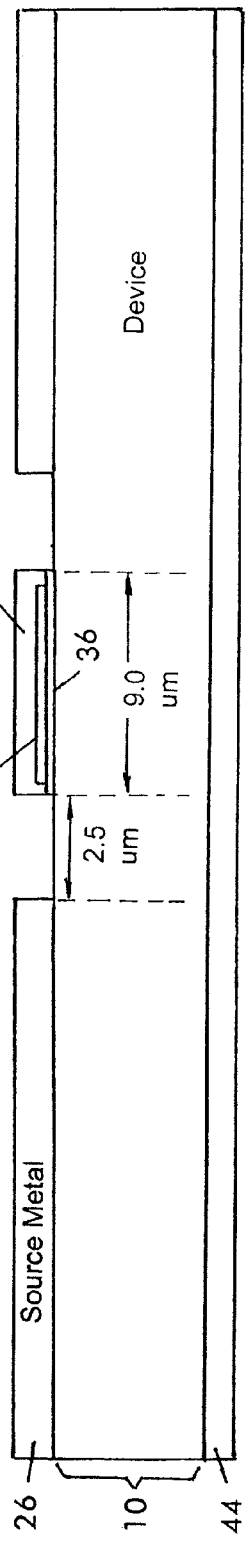

Referring next to FIGS. 2A-2B, a device according to the present invention is fabricated by first forming the active region of the device up until the deposition of first metal layer 26 (FIG. 2A). Thereafter, a layer of metal (e.g. aluminum) for forming first metal layer 26 is deposited atop at least the active region of the device including polysilicon gate bus 34. The metal layer so deposited may be less than two microns thick (e.g. 1-2 microns). The metal layer for forming first metal layer 26 is then patterned using dry etching or a similarly accurate etching process in order to obtain metallic gate bus 28 that is spaced and lateral first metal layer 26. Note that in one embodiment, metallic gate bus 28 may be 9 microns wide and may be spaced from first metal layer 26 by a gap of about 2.5 microns.

Figure 2C:
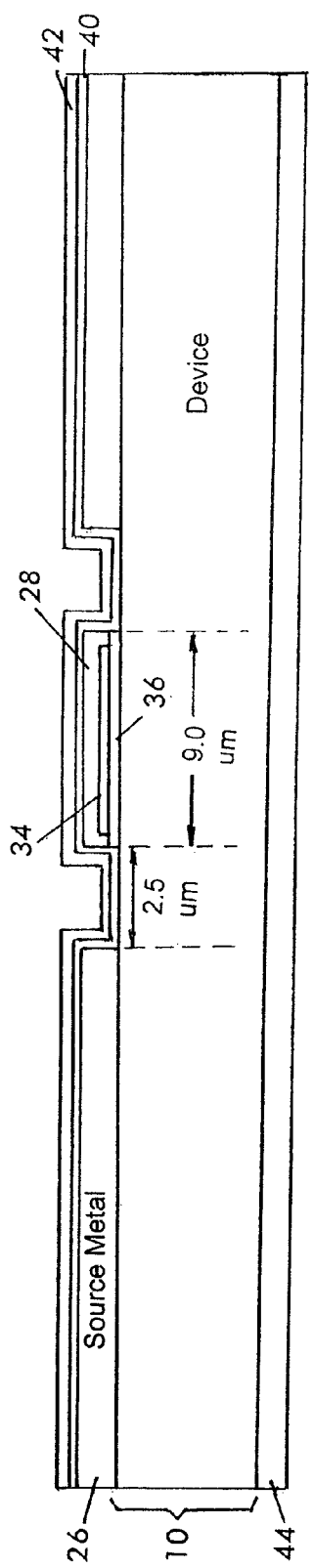

A layer of PSG 40 is then deposited followed by the deposition of a layer of silicon nitride 42, both layers covering first metal layer 26, metallic gate bus 28 and the space between gate bus 28 and first metal layer 26 (see FIG. 2C). Then, buffer body 30 (e.g. polyimide body) is formed over metallic gate bus 28 and the space between metallic gate bus 28 and first metal layer 26 using any suitable method (see FIG. 2D). Next, PSG 40 and silicon nitride 42 are removed from areas not covered by buffer body 30. Note that PSG 40 and silicon nitride 42 under buffer body 30 preferably hermetically seal metallic gate bus 28 (see FIG. 2E). Thereafter, second metal layer 32 which can be preferably between 4 to 20 microns thick is deposited followed by deposition of drain contact 46 to obtain a device according to the present invention as depicted by FIG. 1. Note that second metal layer 32 is patterned to obtain gate pad 29 (FIG. 1A), which is preferably coupled to one or more metallic gate buses 28 through an insulated via 31 as schematically illustrated by FIG. 1A. Optionally, solderable bodies may be formed on all contacts including source, drain and gate contacts. Solderable bodies can have any pattern required by packaging.

The following are some of the advantages of having two metal layers according to the present invention particularly, but not limited to, on low voltage power MOSFETs.

Thus, the use of two metal layers according to the present invention allows for better active area usage by allowing the area under the gate pad to be utilized for active cells, which may be especially important for flip-mountable devices that require larger gate pads and allowing large shrinkage in the metal space design rules.

A device according to the present invention may also exhibit lower Rdson resulting from a lower metal spreading resistance due to the thick metal stack of the first and second metal layers. For example, 10% reduction in overall silicon RDson has been shown possible.

A device according to the present invention may further exhibit lower controlled Rg because it can include multiple gate buses (not normally feasible in flip-mountable devices that require large source contacts) in the first metal layer that do not consume much active area due to the tighter design rules Note that although in the preferred embodiment polyimide is used to form buffer body 30 other materials may be used without deviating from the scope and spirit of the present invention. For example, other organic films such as BCB, or even a thick planarised hard dielectric body, such as a stack of TEOS/SOG/TEOS, can be used instead of polyimide.

The seal provided over the metallic gate bus also contributes further to the reliability of the device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a power semiconductor device, said method comprising:
depositing a first metal layer over an active region formed in a semiconductor body, said active region including source regions and gate electrodes;
dry etching said first metal layer to obtain a first source metal layer and a metallic gate bus that is laterally spaced from said first source metal layer;
forming a buffer body over said gate bus;
depositing a second metal layer over said first metal layer and over said buffer body; and
patterning said second metal layer to obtain a first pad which contacts said first source metal layer and a second pad spaced from said first pad, said second pad being separated from said metallic gate bus by said buffer body, said second pad being electrically coupled to said metallic gate bus by an insulated via that extends through said buffer body.

2. The method of claim 1, wherein said first metal layer and said gate bus are less than 2 microns thick.

3. The method of claim 1, wherein said second metal layer is more than 4 microns thick.

4. The method of claim 1, wherein said second metal layer is more than 4-20 microns thick.

5. The method of claim 1, wherein said buffer body comprises polyimide.

6. The method of claim 1, further comprising a hermetic sealant body disposed between said gate bus and said buffer body.

7. The method of claim 6, wherein said hermetic sealant body comprises a stack of PSG and silicon nitride.

8. A method of fabricating a power semiconductor device, said method comprising:
depositing a first metal layer over an active region formed in a semiconductor body, said active region including source regions and gate electrodes;
dry etching said first metal layer to obtain a first source metal layer and a gate bus that is laterally spaced from said first source metal layer, said gate bus including a metallic gate bus over a polysilicon gate bus and an insulation body between said polysilicon gate bus and said semiconductor body, wherein said gate bus is not disposed within a trench;
forming a buffer body over said gate bus;
depositing a second metal layer over said first metal layer and over said buffer body; and
patterning said second metal layer to obtain a first pad which contacts said first source metal layer and a second pad spaced from said first pad, said second pad being separated from said gate bus by said buffer body, said second pad being electrically coupled to said gate bus by an insulated via that extends through said buffer body.

9. The method of claim 8, wherein a gate pad is coupled to said metallic gate bus through said buffer body.

10. The method of claim 8, wherein said first metal layer is less than 2 microns thick.

11. The method of claim 8, wherein said metallic gate bus is less than 2 microns thick.

12. The method of claim 8, wherein said second metal layer is more than 4 microns thick.

13. The method of claim 8, wherein said second metal layer is more than 20 microns thick.

14. The method of claim 8, wherein said buffer body comprises polyimide.

15. The method of claim 8, further comprising a hermetic sealant body between said gate bus and said buffer body.

16. The method of claim 15, wherein said hermetic sealant body comprises a stack of PSG and silicon nitride.

17. A method of fabricating a power semiconductor device, said method comprising:
- depositing a first metal layer over an active region formed in a semiconductor body, said active region including source regions and gate electrodes;
- dry etching said first metal layer to obtain a first source metal layer and a metallic gate bus that is laterally spaced from said first source metal layer;
- forming a buffer body over said gate bus; and
- depositing a second metal layer over said first metal layer and over said buffer body,
- wherein a hermetic sealant body is disposed between said gate bus and said buffer body.

18. The method of claim 17, wherein said hermetic sealant body comprises a stack of PSG and silicon nitride.

\* \* \* \* \*